United States Patent
Walker et al.

(10) Patent No.: US 8,255,196 B2
(45) Date of Patent: Aug. 28, 2012

(54) CONSTRUCTING A REPLICA-BASED CLOCK TREE

(75) Inventors: William W. Walker, Los Gatos, CA (US); Subodh M. Reddy, San Jose, CA (US); Ranjeez Murgai, Santa Clara, CA (US)

(73) Assignee: Fujitsu Limited, Kawasaki (JP)

( * ) Notice: Subject to any disclaimer, the term of this patent is extended or adjusted under 35 U.S.C. 154(b) by 865 days.

(21) Appl. No.: 12/197,572

(22) Filed: Aug. 25, 2008

(65) Prior Publication Data

US 2010/0049481 A1 Feb. 25, 2010

(51) Int. Cl.
G06F 17/50 (2006.01)

(52) U.S. Cl. .................. 703/13; 703/2; 703/14; 703/19; 716/107; 716/108; 716/111; 716/113; 716/114; 716/119; 716/126; 716/130; 716/132; 716/133; 716/134; 716/135

(58) Field of Classification Search ............. 703/13, 703/14, 19, 2, 21; 716/108, 113, 114, 119, 716/126, 132, 107, 111, 130, 133, 134, 135
See application file for complete search history.

(56) References Cited

U.S. PATENT DOCUMENTS

| | | | | |
|---|---|---|---|---|
| 5,648,911 A * | 7/1997 | Grodstein et al. | ............. | 716/104 |
| 5,774,371 A * | 6/1998 | Kawakami | ............. | 716/113 |
| 6,009,248 A * | 12/1999 | Sato et al. | ............. | 716/114 |
| 6,205,572 B1 * | 3/2001 | Dupenloup | ............. | 716/106 |
| 6,253,356 B1 * | 6/2001 | Kung | ............. | 716/114 |
| 6,253,358 B1 * | 6/2001 | Takahashi | ............. | 716/114 |
| 6,311,313 B1 * | 10/2001 | Camporese et al. | ............. | 716/113 |
| 6,347,393 B1 * | 2/2002 | Alpert et al. | ............. | 716/114 |
| 6,453,446 B1 * | 9/2002 | van Ginneken | ............. | 716/114 |
| 6,553,338 B1 * | 4/2003 | Buch et al. | ............. | 703/14 |
| 6,622,291 B1 * | 9/2003 | Ginetti | ............. | 716/108 |
| 6,654,712 B1 * | 11/2003 | Blair | ............. | 703/14 |
| 6,684,373 B1 * | 1/2004 | Bodine et al. | ............. | 716/114 |
| 6,754,877 B1 * | 6/2004 | Srinivasan | ............. | 716/114 |
| 6,907,590 B1 * | 6/2005 | Al-Dabagh et al. | ............. | 716/113 |
| 6,993,737 B1 * | 1/2006 | Anderson et al. | ............. | 716/109 |
| 7,010,767 B2 * | 3/2006 | Elassaad et al. | ............. | 716/114 |
| 7,039,891 B2 * | 5/2006 | Tetelbaum | ............. | 716/113 |
| 7,093,217 B1 * | 8/2006 | Signore et al. | ............. | 716/111 |
| 7,187,573 B2 * | 3/2007 | Terada et al. | ............. | 365/63 |
| 7,197,732 B2 * | 3/2007 | Murgai | ............. | 716/114 |
| 7,480,886 B2 * | 1/2009 | Carney et al. | ............. | 716/134 |
| 7,669,161 B2 * | 2/2010 | Lin | ............. | 716/55 |
| 7,673,260 B2 * | 3/2010 | Chen et al. | ............. | 716/106 |
| 7,721,236 B2 * | 5/2010 | Hwang et al. | ............. | 716/113 |
| 7,831,946 B2 * | 11/2010 | Dennis et al. | ............. | 716/113 |
| 7,877,719 B2 * | 1/2011 | He | ............. | 716/114 |
| 7,908,573 B2 * | 3/2011 | Lin | ............. | 716/54 |
| 7,940,365 B2 * | 5/2011 | Gettemy et al. | ............. | 349/151 |
| 8,010,932 B2 * | 8/2011 | Durham et al. | ............. | 716/133 |

(Continued)

Primary Examiner — Hugh Jones
Assistant Examiner — Kibrom Gebresilassie
(74) Attorney, Agent, or Firm — Baker Botts L.L.P.

(57) ABSTRACT

A system and method for constructing a clock tree based on replica stages is described. The system and method may comprise determining a size of an input buffer for driving a load capacitance of the output buffer based on a fanout, determining a wire width and a wire length based on the size of the output buffer, the fanout and a replica stage mathematical model, and connecting the output buffer and the corresponding input buffer to a conductor routed on one or more predetermined metal layers and having the wire length and the wire width. The conductor is placed within ground shields having a fixed width.

25 Claims, 11 Drawing Sheets

U.S. PATENT DOCUMENTS

| | | | |
|---|---|---|---|
| 2001/0043102 A1* | 11/2001 | Kuge | 327/161 |
| 2002/0004929 A1* | 1/2002 | Osaki et al. | 716/10 |
| 2002/0068989 A1* | 6/2002 | Ebisawa et al. | 700/121 |
| 2003/0167451 A1* | 9/2003 | Igarashi | 716/5 |
| 2004/0210857 A1* | 10/2004 | Srinivasan | 716/2 |
| 2004/0225984 A1* | 11/2004 | Tsao et al. | 716/10 |
| 2004/0243964 A1* | 12/2004 | McElvain et al. | 716/12 |
| 2004/0257207 A1* | 12/2004 | Elassaad et al. | 340/425.1 |
| 2005/0010884 A1* | 1/2005 | Lu et al. | 716/6 |
| 2005/0040846 A1* | 2/2005 | Otsuka et al. | 326/31 |
| 2005/0102643 A1* | 5/2005 | Hou et al. | 716/6 |
| 2005/0128818 A1* | 6/2005 | Terada et al. | 365/189.05 |
| 2006/0015834 A1* | 1/2006 | Amekawa | 716/5 |
| 2006/0107244 A1* | 5/2006 | Yonezawa | 716/4 |
| 2006/0190899 A1* | 8/2006 | Migatz et al. | 716/13 |
| 2006/0284648 A1* | 12/2006 | Himeno et al. | 326/82 |
| 2006/0288320 A1* | 12/2006 | Murgai et al. | 716/6 |
| 2007/0096775 A1* | 5/2007 | Elgebaly et al. | 327/105 |
| 2008/0059933 A1* | 3/2008 | Barke et al. | 716/13 |
| 2008/0141206 A1* | 6/2008 | He | 716/12 |
| 2009/0113365 A1* | 4/2009 | Panigrahi et al. | 716/6 |
| 2010/0115476 A1* | 5/2010 | Adams et al. | 716/2 |
| 2010/0235802 A1* | 9/2010 | Singasani | 716/12 |
| 2011/0046967 A1* | 2/2011 | Setoguchi | 704/503 |
| 2011/0066996 A1* | 3/2011 | Koyuncu et al. | 716/126 |
| 2011/0138349 A1* | 6/2011 | Panigrahi et al. | 716/134 |

* cited by examiner

FIG. 3

| n | | C0 | C1 | C2 | C3 | RMS ERROR |
|---|---|---|---|---|---|---|
| W | 1,2,3,4 | $-2.9436 \times 10^{-1} \mu m$ | $4.9284 \times 10^{-2}$ | $-2.9338 \times 10^{-4} \mu m^{-1}$ | 0 | 0.09% |
| L | 1 | $1.3224 \times 10^{-2}$ mm | $1.0786 \times 10^{-1}$ mm/$\mu$m | $-2.4315 \times 10^{-3}$ mm/$\mu m^2$ | $1.9261 \times 10^{-5}$ mm/$\mu m^3$ | 0.09% |
| | 2 | $9.6003 \times 10^{-3}$ mm | $7.5919 \times 10^{-2}$ mm/$\mu$m | $-1.7910 \times 10^{-3}$ mm/$\mu m^2$ | $1.5692 \times 10^{-5}$ mm/$\mu m^3$ | 0.11% |
| | 3 | $7.4281 \times 10^{-3}$ mm | $5.6099 \times 10^{-2}$ mm/$\mu$m | $-1.3495 \times 10^{-3}$ mm/$\mu m^2$ | $1.1705 \times 10^{-5}$ mm/$\mu m^3$ | 0.07% |
| | 4 | $5.8682 \times 10^{-3}$ mm | $3.9247 \times 10^{-2}$ mm/$\mu$m | $-9.1397 \times 10^{-4}$ mm/$\mu m^2$ | $7.7293 \times 10^{-6}$ mm/$\mu m^3$ | 0.013% |

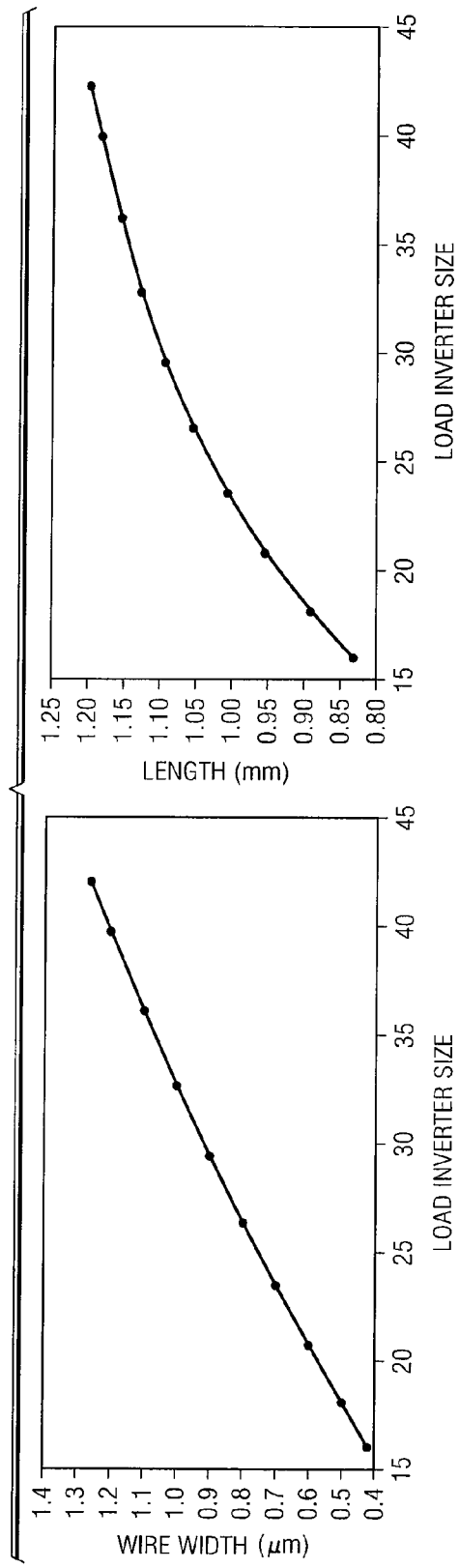

FIG. 4

CONSTRUCTING A REPLICA-BASED CLOCK TREE

TECHNICAL FIELD OF THE INVENTION

This invention relates in general to integrated circuits and, more particularly, to techniques for constructing a replica-based clock tree.

BACKGROUND

A clock tree is used to distribute a clock to flip-flops in a synchronous digital integrated circuit (IC), such as a microprocessor. A synchronous design typically requires that all flip-flops be clocked at the same time, or that their clocks have known offsets relative to each other. It is a difficult challenge to design a clock distribution network that ensures synchronicity of clock arrival times, typically requiring special purpose software and a significant amount of manual custom design and simulation. Failure to achieve required arrival times of clocks at flip-flops results in either degraded performance (longer cycle time) or outright failure (a race condition). Moreover, even if a clock distribution network achieves the required arrival times for a particular process, temperature, and voltage (PVT) corner or set of PVT corners, it is difficult or impossible to simulate all possible PVT corners. For example, a corner in which metal is thin (resulting in large metal resistance but also smaller metal capacitance) coupled with maximum channel length transistors (resulting in large gate load capacitances and slower drive strength) is not even included in most process corner simulations. A clock distribution network in which different branches have different sensitivities to this corner will exhibit differing arrival times (skew) at flip flops connected to these branches, possibly resulting in unanticipated circuit failure.

SUMMARY

In accordance with the present invention, certain disadvantages and problems associated with constructing clock distribution networks have been substantially reduced or eliminated. In particular, this invention addresses the skew problem by proposing the use of a replica clock tree.

In accordance with one embodiment of the present invention, a method of constructing a replica stage for a circuit having an output buffer is provided. In such an embodiment, the method comprises determining a size of an input buffer for driving a load capacitance of the output buffer, determining a wire width and a wire length based on the size of the input buffer and a replica stage polynomial model, and connecting the output buffer and the corresponding input buffer to a conductor having the wire length and the wire width. The conductor (clock wire) has on both sides a ground shield having a fixed width to reduce sidewall capacitance effects of the replica stage.

An important technical advantage of certain embodiments of the present invention includes minimizing sensitivity of skew to PVT corner, so that even if skew is simulated only in a single PVT corner, the skew will change negligibly in any other PVT corner.

Another important technical advantage of certain embodiments of the present invention is that all branches can have the same delay. Therefore, only one branch needs to be simulated in a high-accuracy simulator, such as SPICE, and the results can be applied to all branches that are replicas of the simulated branch. This greatly improves the accuracy and speed of clock tree delay simulation. It also simplifies the physical design of the clock tree.

Other technical advantages of the present invention may be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present invention and its advantages, reference is now made to the following description, taken in conjunction with the accompanying drawings, in which:

FIG. 3 is a table that lists the resulting coefficients of a replica stage polynomial model constructed according to the example method of FIG. 2;

FIG. 4 is a plot of replica stage polynomial models of wire length and wire width for a binary replica of a 90 nm process constructed according to the example method of FIG. 2;

DETAILED DESCRIPTION OF THE INVENTION

The following detailed description of the invention includes example embodiments of a clock tree implemented with a 90 nm CMOS logic process. The novel principles of the invention, however, are not intended to be limited to this particular embodiment.

In a replica clock tree design, branches are designed using replica techniques to minimize skew. Due to PVT variations, this skew is generally unmeasurable, and must be treated as uncertainty (also known as "jitter") during timing analysis.

Scalable replica stages may be designed as part of the technology characterization process, and their design parameters may be input to software via a technology file. Replicas designed according to the principles described herein advantageously cancel out the component of clock skew uncertainty resulting from die-to-die PVT variations in typical cases. Moreover, replicas have substantially identical delay per stage, eliminating the need to calculate delays during clock synthesis.

FIGS. 1A-D are diagrams that illustrate embodiments of a replica stage. As used in this specification, a "replica" is a circuit that has the same delay and same PVT sensitivity of another circuit (the "model" or "base" circuit) even though it may not be physically identical. Two identical circuits are replicas of each other, and so are two circuits whose wires and gates are appropriately scaled. In general, since capacitances of different clock end-points (for example, flip-flops, latches, registers) are different and the distribution of clock end-points on the chip is asymmetric, identical replicas are not sufficient for clock design. We do need scaled replicas. In clock design, a replica circuit or stage refers to a driving gate (usually an inverter or buffer) driving a load through a wire. Also, stage delay refers to the delay from the input of the driver to the input of the load.

In this specification, the term "conductor" and "wire" are used interchangeably to refer to any substance or medium capable of conducting or carrying a signal. A "signal" may include without limitation any light, sound, or electromagnetic wave or impulse whose variations represent information.

Figure 1A:
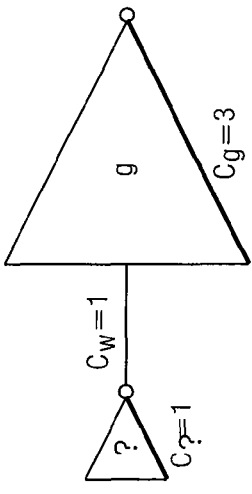
FIGS. 1A-D are diagrams that illustrate replica stage embodiments.
Figure 1C:
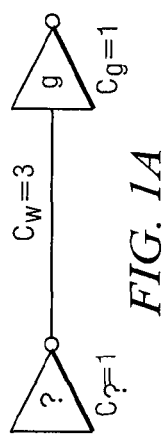
Figure 1B:
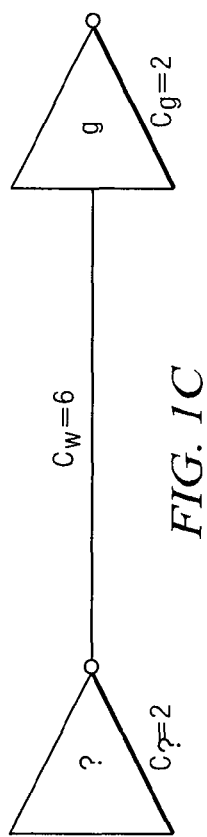

Consider the circuit shown in FIG. 1A. An inverter I with capacitance $C_I=1$ drives a sink g with capacitance $C_g=1$ through a wire, whose capacitance is $C_w=3$. The driver fanout may be defined as a ratio of total load capacitance to input capacitance. In FIG. 1A, since I's total load capacitance is 4 and $C_I=1$, its fanout is 4/1=4. Similarly, the circuits of FIG. 1B and FIG. 1C also have driver fanout of 4. Since the delay through I depends on the driver fanout, all three circuits have identical driver delays. The three circuits will have identical stage delays if all wire delays are zero (in other words, wire resistivity is zero). Now, consider a scenario where due to die-to-die variations, all gate capacitances go up by 10% and all wire capacitances go down by 10% (gate and wire variations can be uncorrelated due to different kinds of manufacturing steps). Then, $C_g'=1.1\,C_g$, $C_I'=1.1\,C_I$, and $C_w'=0.9\,C_w$. The new driver fanouts for FIG. 1A=(1.1+2.7)/1.1=3.45, for FIG. 1B=(3.3+0.9)/1.1=3.82, and for FIG. 1C=(2.2+5.4)/2.2=3.45. Since the driver fanouts of FIGS. 1A and 1C are still identical, their drivers will have identical delays even in the presence of variations. However since the driver fanout of FIG. 1B is larger (by about 11%), its delay will also be considerably larger than that of FIGS. 1A and 1C. Thus, FIG. 1B is not a replica of FIG. 1A, but FIG. 1C is. FIG. 1A and FIG. 1C have identical delays, even in the presence of die-to-die (or common-mode) variations. Note that the load capacitance, driver capacitance, and wire capacitance of FIG. 1C are 2 times each of FIG. 1A's capacitances respectively (i.e., the scale factor s=2). An implication of this is that $C_g/C_w$ should be identical for original and scaled replica stages.

Figure 1D:
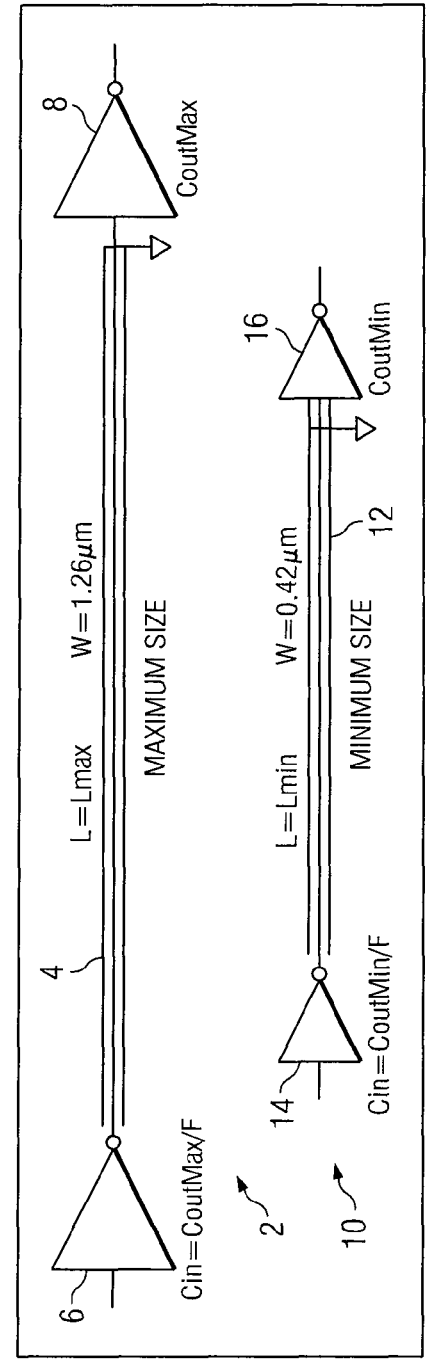

In FIG. 1D, stage 2 represents the maximum size of a stage in a 90 nm process. Stage 2 includes a conductor 4 connected to driving or input buffer 6. FIG. 1D also depicts load or output buffer 8 connected to conductor 4. As FIG. 1D illustrates, the maximum width of the conductor, Wmax, in the 90 nm process is 1.26 μm at a specific metal layer. In general, the maximum conductor length, Lmax, is a function of replica-stage fanout F. The output capacitance (Cout) of stage 2 should be equivalent to the capacitance of load buffer 8. The input capacitance (Cin) of driving buffer 6 is also determined by the capacitance of load buffer 8, although more indirectly.

More specifically, the input capacitance should be equivalent to the output capacitance scaled by a factor of 1/F, where F is called the replica stage fanout or simply fanout in the rest of the discussion. Of particular note, the reference numbers in all figures are merely illustrative and depend upon the particular process in use and the layers in which the elements are implemented. In addition, while many of the embodiments described use n, the number of branches, F can be used instead of n such that there is only one variable F—ratio of two different capacitive values Cin/Cout. Thus F may be used where n is specified.

Stage 10 in FIG. 1D represents the minimum size of a stage in a 90 nm process. Stage 10 includes a conductor 12 connected to driving buffer 14. Stage 10 is connected to load buffer 16. As indicated, the minimum width of conductor 12 in a 90 nm process is 0.42 μm at a specific metal layer. The minimum conductor length, Lmin, like Lmax, is a function of F. The output capacitance of stage 10 should be equivalent to the capacitance of load buffer 16. As with driving buffer 6, the input capacitance of driving buffer 14 should be equivalent to the output capacitance scaled by a factor of 1/F.

Figure 2:
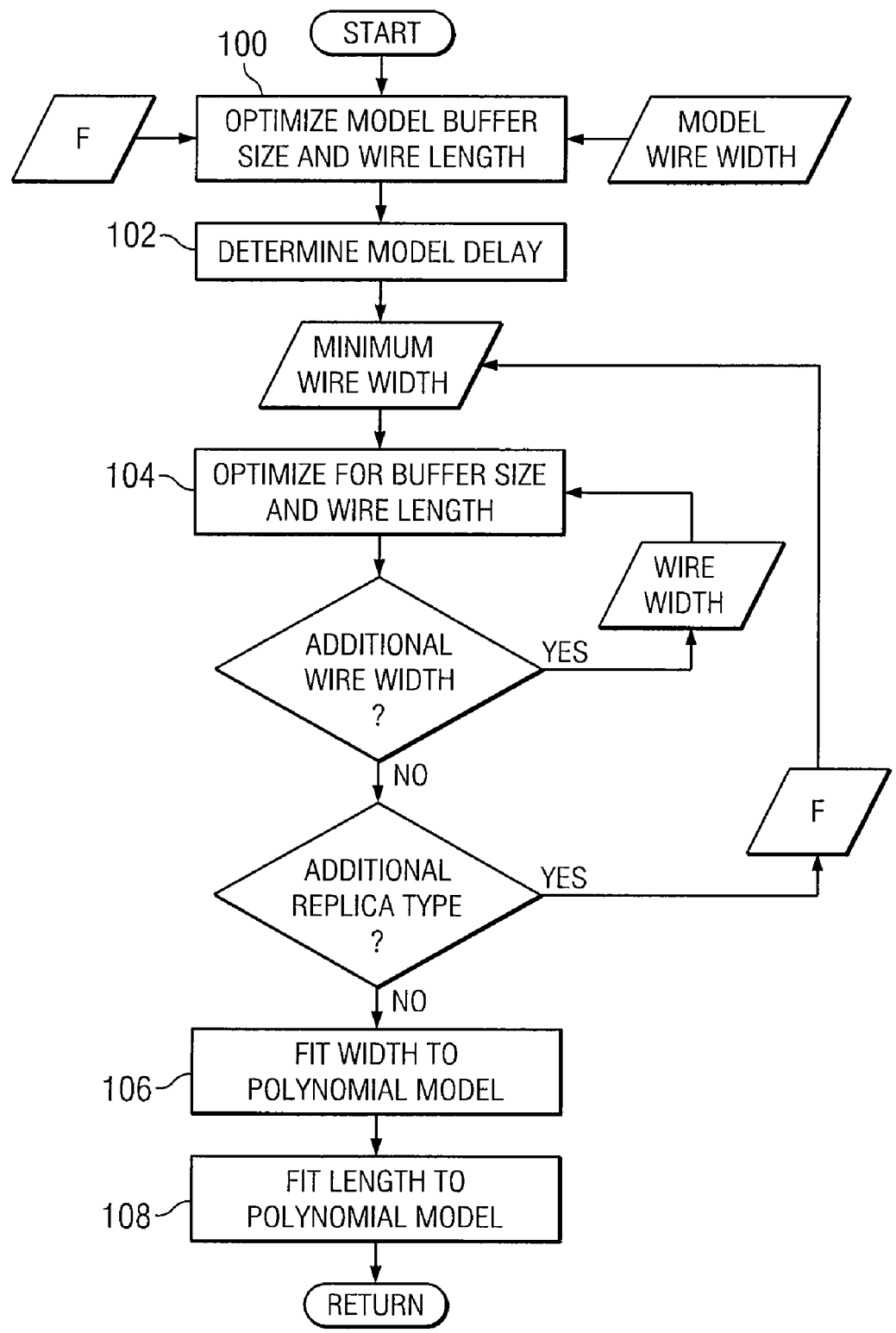
FIG. 2 is a flow diagram that illustrates one example of a method for designing and/or constructing a replica stage.

FIG. 2 is a flow diagram that illustrates one example of a method for designing and/or constructing a replica stage. Wire width and length are both scaled for constant stage delay. To get back to the center of mass (average location of all clock sinks, weighted by the capacitance of the sinks) as quickly as possible, a replica model is designed to minimize the delay per unit length of wiring. In this model stage, also called the model maximum circuit stage, the maximum allowed wire width and the maximum output load CoutMax are used and the maximum wire length is computed. It is also possible to design a replica model to minimize power dissipated in the stage or a combination of the delay per unit length and dissipated power. The smallest or minimum stage replica is then designed by setting the minimum wire width and finding the driving buffer capacitance and wire length that produce the same delay as the model stage. This procedure is repeated for several widths between the minimum and maximum, and fit to a polynomial model.

The method of FIG. 2 assumes various design constraints, including the assumption that output capacitance is lumped at the end of the conductor, and that no branches are allowed, except that input gates may be connected. Moreover, the ratio of output capacitance to wire capacitance (Cout/Cwire) is a constant. This is a significant constraint for a replica, because it ensures that any deviation from nominal gate or wire capacitance has the same effect on all stages. Also, the ratio of output capacitance to input capacitance (Cout/Cin) is a constant, F.

As FIG. 2 illustrates, step 100 comprises determining a first driving buffer size (referred to as the model driving buffer size) and a first wire length (referred to as the model wire length) that minimize a delay per unit of wire length for a model stage having a predetermined fanout and a predetermined maximum wire width. One technique for determining the first (i.e. base) driving buffer size is to first determine a reasonable value of the average capacitance a replica needs to drive, and then use a circuit simulator (such as SPICE) to optimize the driving buffer size and wire length for a maximum wire width such that the delay per unit length is minimized. Accordingly, the model driving buffer size may also be referred to as the "maximum driving buffer size," and the model wire length may be referred to as the "maximum wire length."

Accordingly, a circuit simulator may be used to design a binary stage (F=2) that optimizes minimizes the delay per unit length of the wire for a width of 1.26 μm. Binary stages are common in clock trees driving long wires, so minimizing the point-to-point delay for a binary stage is desirable for achieving a small source-to-sink latency. Generally, the model driving buffer size and model wire length are equivalent to the driving buffer size and wire length that result in the shortest delay, but other constraints may prevail. For instance, if a coordinate buffer size and wire length minimize the delay but significantly exceed the average load capacitance, then the stage may be designed with a model buffer size and wire length that produce the smallest delay without substantially exceeding the load capacitance. Thus, for a 90 nm process, a binary branch may comprise a maximum driving buffer size of 42 µm and a maximum wire length of 1.2 mm.

Step 102 comprises determining a delay associated with the model stage having the maximum driving buffer size, wire width, and wire length. Algorithms for calculating a delay for a given driving buffer and wire are well-known, and need not be described in detail here.

Step 104 comprises determining a second driving buffer size and a second wire length that substantially reproduces the delay of the model stage in a replica stage having the predetermined fanout F and a predetermined minimum wire width. Because the results are based on a minimum wire width, the second driving buffer size may be referred to as the "minimum driving buffer size," and the second wire length as the "minimum wire length." Again, a circuit simulator may be used to determine the minimum driving buffer size and wire length for a binary stage, within the constraints discussed above. For example, a circuit simulator may be used to simulate a binary stage in a 90 nm process, which has a minimum wire width of 0.42 µm. In such an example, the circuit simulator should indicate that a minimum driving buffer size of 16 µm and a minimum wire length of 0.831 mm reproduce the delay of the model stage.

Step 104 may be repeated with at least one additional wire width that is greater than the minimum wire width but less than the maximum wire width to determine one or more intermediate driving buffer sizes and wire lengths that substantially reproduces the delay in a replica stage having the predetermined fanout F.

Likewise, step 104 may be repeated to replicate stages having fewer or greater fanout F, using the maximum and minimum driving buffer size determined in steps 100-102 as additional constraints. These additional constraints result in variances of the delay per stage in these replica stages.

Finally, steps 106-108 comprise fitting the simulated data to a polynomial model that represents the wire width and wire length of replica stages as a function of load buffer size. More particularly, step 106 comprises modeling a wire width of the circuit stage as a polynomial fit to the maximum wire width, the minimum wire width, and at least one intermediate wire width. Step 108 comprises modeling a wire length of the circuit stage as a polynomial fit to the maximum wire length, the minimum wire length, and at least one intermediate wire length.

Given a load inverter size, the following formula may be used to determine the correct wire width and length to produce a replica. The polynomial models of the replica wire length and width may take the respective forms:

$$L = C_{0L} + C_{1L}WN + C_{2L}WN^2 + C_{3L}WN^3$$

$$W = C_{0w} + C_{1w}WN + C_{2w}WN^2 + C_{3w}WN^3$$

where WN is the NMOS channel width of the load buffer, and C0L to C3L and C0W and C3W are coefficients derived using a least squares method. FIG. 3 illustrates the results for repeater replicas (n=1), binary replicas (n=2), ternary replicas (n=3), and quad replicas (n=4). Note that the wire width model is the same for all values of n.

FIG. 4 is a plot of the replica stage polynomial models of wire length and wire width for a binary replica of the 90 nm process. The model is represented in the plots as a solid line, whereas the results of the simulation are represented as discrete symbols.

Figure 5:
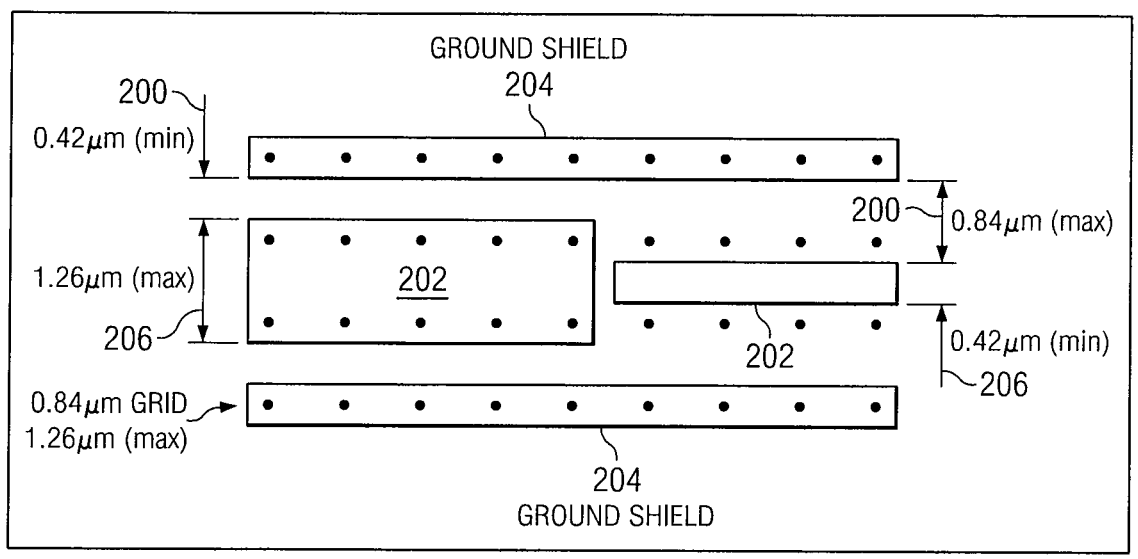
FIG. 5 is a simple diagram that illustrates a method for alleviating the effects of sidewall capacitance in a replica stage.

FIG. 5 is a simple diagram that illustrates a method for alleviating the effects of sidewall capacitance (i.e., capacitance to the neighboring wires) in a replica stage and crosstalk noise from adjacent wires. A true replica stage would simply scale the driving buffer by the same factor as the load, and scale the wire width and wire length by the square root of that factor. Sidewall capacitances, however, can significantly affect the accuracy of such a simple replica model. The effects of sidewall capacitance may be reduced substantially by increasing the spacing 200 between the conductor 202 and a ground shield 204 as the wire width 206 is reduced. Stated another way, the width of the ground shield 204 is constant, while the wire width 206 varies according to replica stage polynomial model. The ground shields make the replica wire immune to crosstalk noise.

Figure 6:
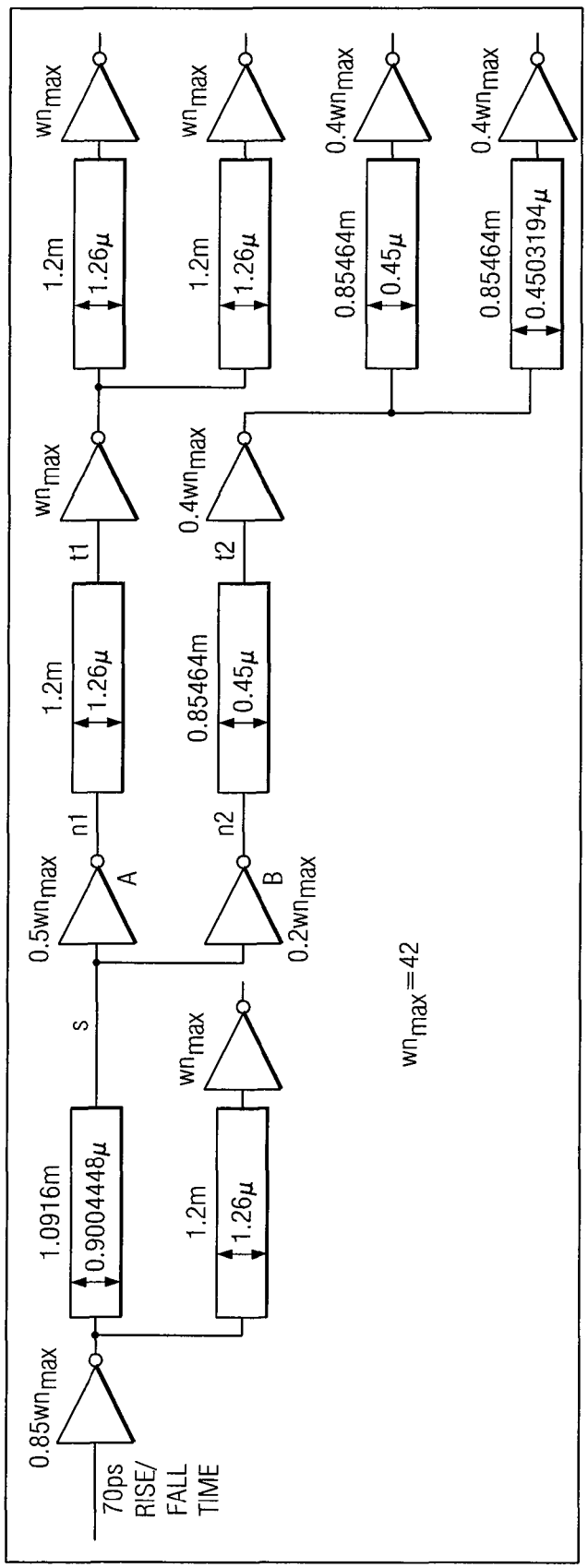
FIG. 6 illustrates a technique for merging driving buffers.

FIG. 6 illustrates a technique for merging driving buffers. A perfect replica reproduces the voltages of a model stage or another replica at every point in the stage. In FIG. 6, then, nodes n1 and n2 should be at the same potential, and buffers A and B may be merged. In general, driving buffers may be merged if the driving buffers have the same input and are adjacently located. The size of the resulting driving buffer should be the sum of the sizes of the merged driving buffers. Merging buffers also has the additional benefit of eliminating skew between the individual buffers, as well as decreasing the number of objects to be placed and routed. However, the practice of merging buffers may be limited by space constraints since the single buffer will be larger than the two separate buffers and it may be more difficult to place the larger buffer in a crowded design.

Figure 7:
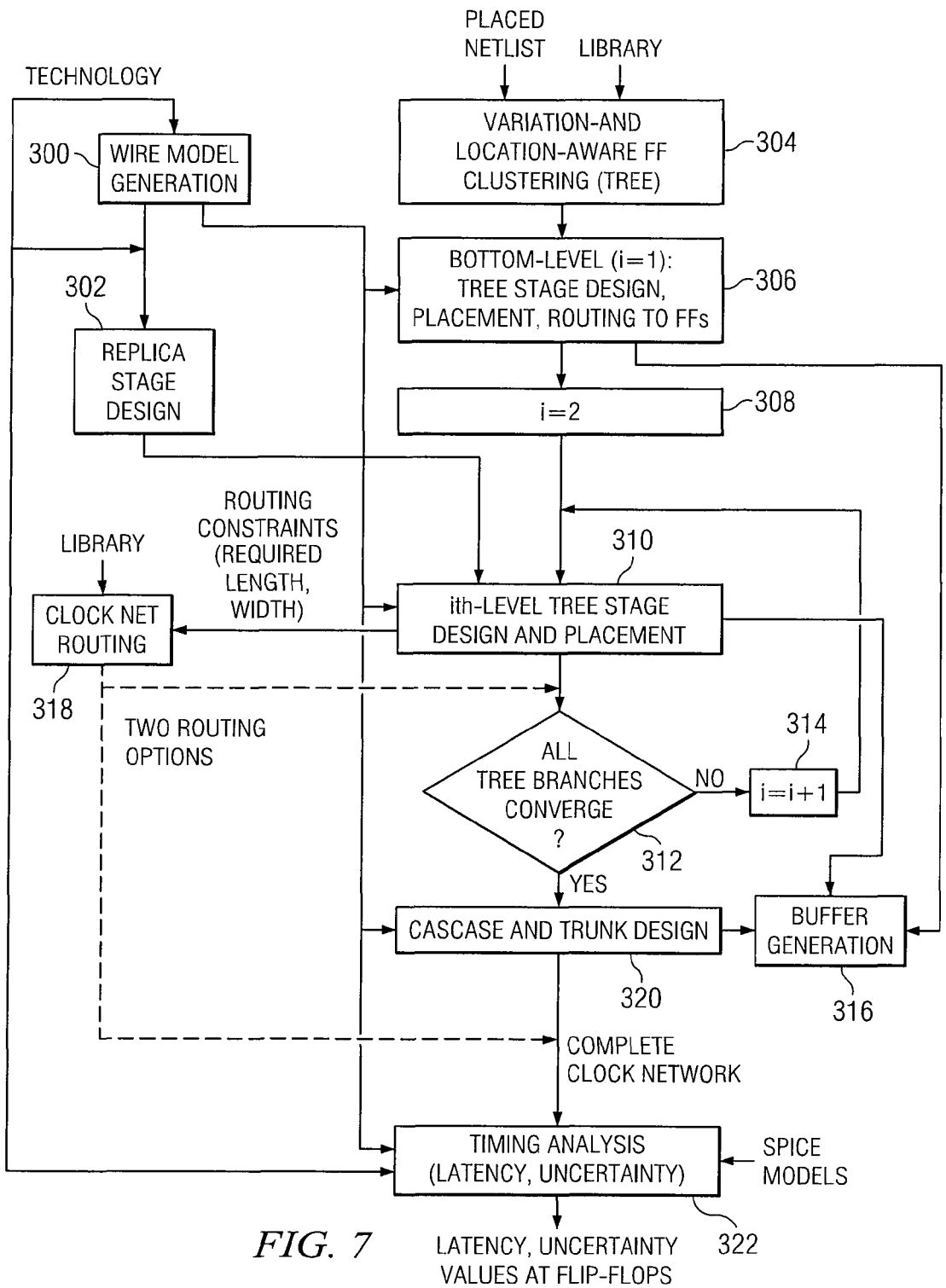
FIG. 7 is a flow diagram that illustrates a method for clock network design for a block-level design.

FIG. 7 is a flow diagram that illustrates a method for clock network design for a block-level design. In steps 300-302, the technology is pre-characterized by creating wire models and replica stage design, assuming two-sided shielding. For a pure tree architecture, a location-based and variation-aware flip-flop clustering is used (304), beginning with the bottom-level (306). Each flip-flop cluster is driven by a buffer whose size is determined by the total capacitive load it drives. This load is sum total of the input pin capacitances of the driven flip-flops and capacitances of the wires connecting it to the flip-flops. These wires may be routed first to accurately determine their capacitance and hence the buffer size (306). For a mesh-based architecture, flip-flops connect to the nearest mesh segment, so the bottom-level consists of the mesh buffers that drive the mesh. The subsequent tree levels in both clock architectures are designed based on the replica stage design (308-314). After designing each stage in the level, the buffers on that level are placed (316). The replica algorithm specifies the length, width and metal layers of each wire connecting a buffer and its child. These requirements are passed to a clock router (318), which can either perform the routing after each level or at the end of the entire tree construction. After all the tree branches converge to a physical point, a trunk may be used to connect the last replica stage to the clock pin (320). This completes the clock network construction. This is then passed to a clock timing analyzer, which simulates latency and uncertainty values for the flip-flops (322).

Figure 8:
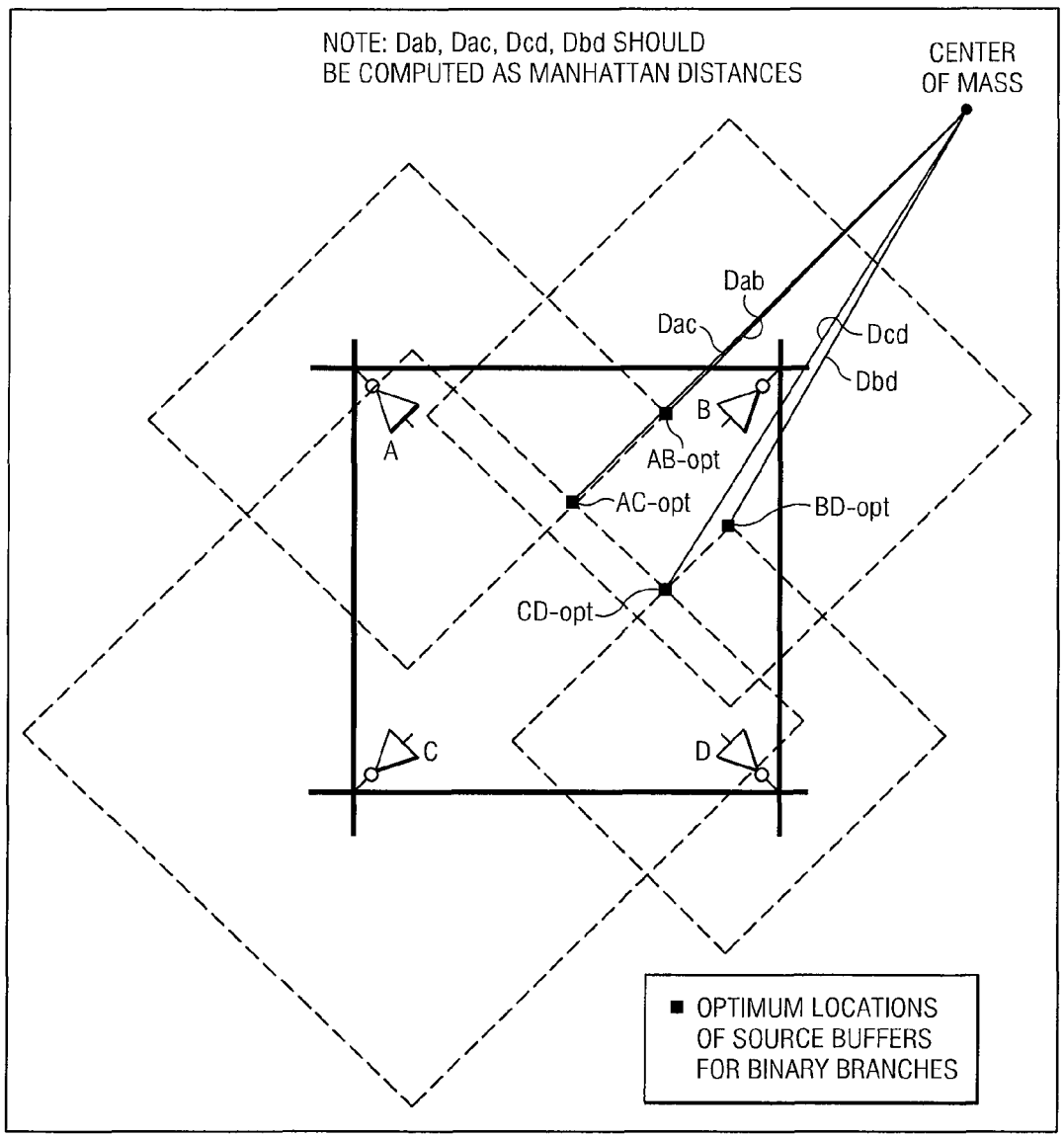
FIG. 8 illustrates a binary replica tree driving base buffers in a fairly coarse mesh.

FIG. 8 illustrates a binary replica tree driving base buffers in a fairly coarse bottom-level mesh in a mesh-based clock distribution scheme. Four variable size buffers are shown, labeled A, B, C, D, driving adjacent mesh cross-points in the X and Y direction. Assuming each CL<CoutMax, using the results of the replica stage design discussed above, we can compute the wire length associated with each buffer to its driver. Then, the locus of points reachable from each buffer using a wire of the corresponding length from the buffer input is plotted around each buffer. Since the wiring has a Manhattan geometry, each locus will be a diamond. A larger diamond indicates a larger load and a longer wire length.

There are two possible scenarios. First, a sufficient set of diamond overlaps exists, i.e., it is possible to build either binary trees {A-B, C-D} or {A-C, B-D}, or both, where the notation {i-j, k-l} means a binary tree driving i and j, and another binary tree driving k and l, are possible. Second, it is not possible to build two binary trees because of insufficient overlap of the diamonds. In this latter scenario, a repeater stage or an amputee binary branch may be required.

In the first scenario, in which both {A-B, C-D} or {A-C, B-D} are possible, the next step is to find the optimum location of the drivers for each of the four binary trees. The optimum placement of the source buffer for two loads i and j is the point in the intersection of the i and j diamonds closest to the center of mass. The optimum placements for all four possible binary trees are shown in FIG. 8. {A-B, C-D} and {A-C, B-D} trees should be selected based on the minimum sum of the distances from the sources to the center of mass. That is, if (Dab+Dcd)<(Dac+Dbd) then select {A-B, C-D}, otherwise select {A-C, B-D}.

The effect of obstructions is to erase the areas of diamonds overlapped by the obstruction. If the obstruction makes it impossible to build a binary branch, then either an amputee binary branch can be built, or a repeater branch can be built.

Figure 9:
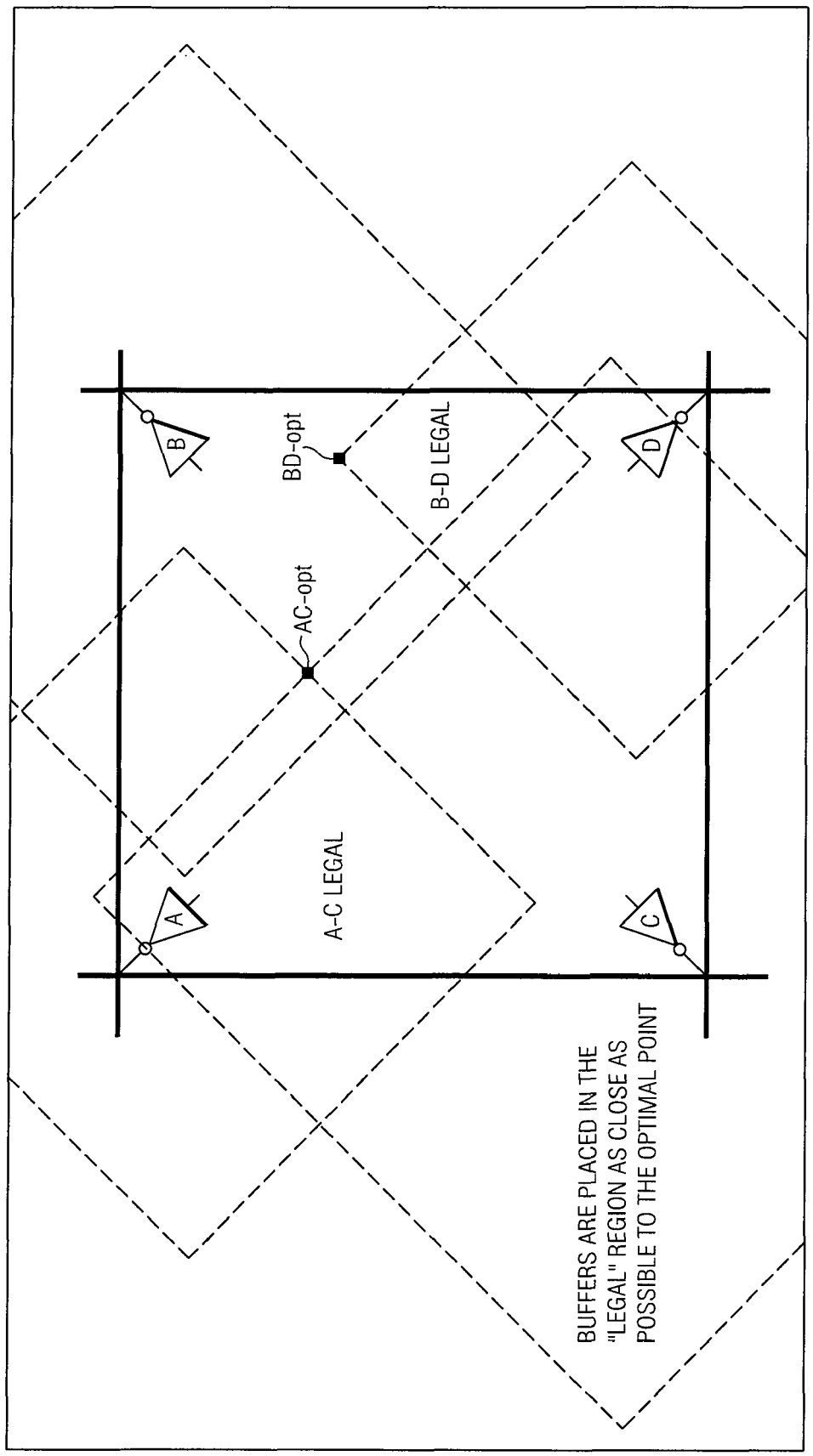
FIG. 9 illustrates an example procedure for placing the driving buffers of FIG. 9.

Assuming {A-C, B-D} pairing, FIG. 9 shows the procedure for placing the driving buffers. The intersection of the diamonds defines the "legal" placement region. The optimal placements are typically on the edge of the legal region closest to the clock source. The buffers must be placed within the legal region as close as possible to the optimum location. If one or both placements fail, it is possible to try the other pairing {A-B, C-D}.

Figure 10:
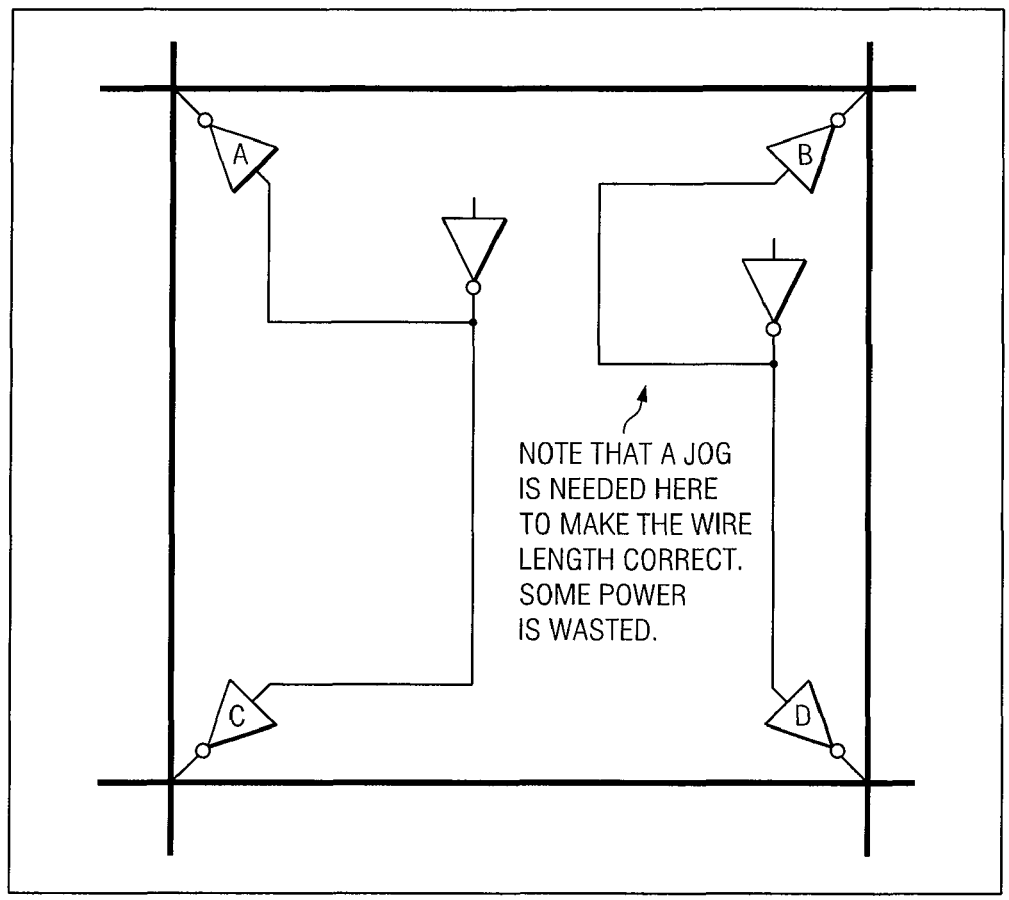
FIG. 10 illustrates an embodiment of a method for designing other tree types.

FIG. 10 illustrates routing implications of buffer placement. It corresponds to selecting the pairing {A-C, B-D} and placing the driving buffers at points AC-opt and BD-opt respectively of FIG. 9. Since the driving buffer of B and D is not on the edge of the legal region for B, when connecting it to B, a routing jog is needed to make the wire length from the driving buffer to B meet the required wire length. A jog is not needed from the driving buffer of B and D to buffer D, since the driving buffer is on the edge of the legal region of D.

Above the base of the tree, the algorithm for designing replica trees is basically the same as the base algorithm, except the array of buffers at the first level may be much less uniform. In this case, the pairing algorithm (for a binary tree) will be slightly more complicated. In addition, as the distance between buffers increases, it will be increasingly necessary to consider reducing n from its starting value. For example, if the bottom stage used n=4, n=3, 2, or 1 may be needed for subsequent stages.

Figure 11:
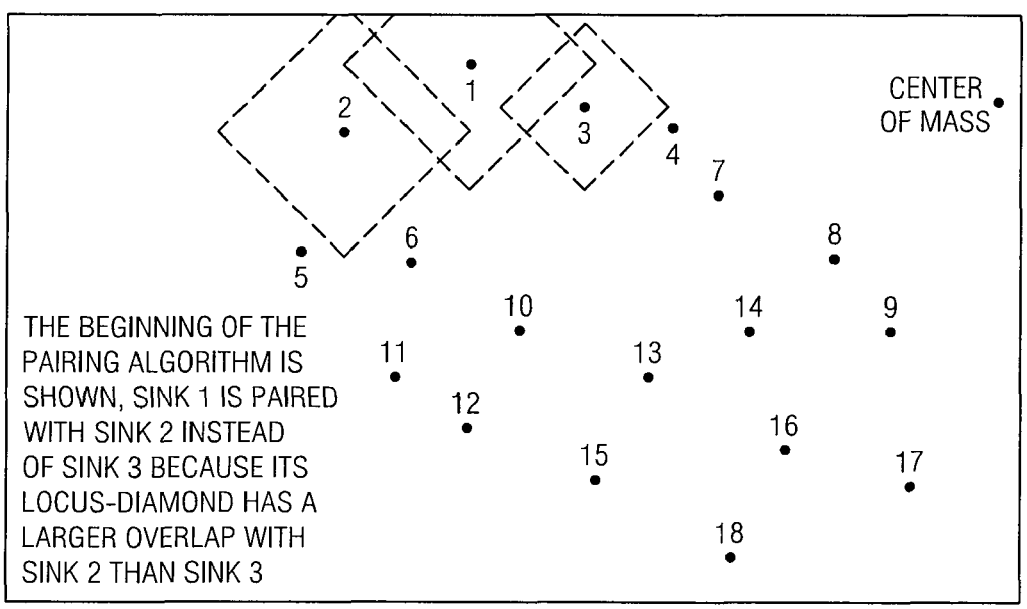
FIG. 11 is a simple diagram of an array of sinks at a given level of a fanout tree that is used to illustrate one embodiment of a method for deciding between a repeater stage and a binary branch (n=2) stage level, a method for pairing buffers, and a method for adding repeater stages.

FIG. 11 is a simple diagram of an array of sinks at a given level of a fanout tree that is used to illustrate one embodiment of a method for deciding between a repeater stage and a binary branch (n=2) stage, a method for pairing buffers, and a method for adding repeater stages. Sink i is located at (xi,yi) and has capacitance Ci. First, it should be determined whether the 18 sinks can be reduced to 9 sinks at the next level up using binary stages, or whether they need repeater stages to bring them closer together. Using binary stages is generally preferable, if possible, because binary stages reduce jitter by combining loads onto a common wire at the next level of the tree. Some stages, however, may be pairable into binary sinks, while some may be too far apart. Since binary is preferable, a decision based on a simple majority may not be the best decision. And, if a repeater stage level is selected, then it should be determined whether the 18 sources should be moved closer to the center of mass, closer to each other so they can be paired at the next level, or some combination. If a binary level is selected and not all stages are close enough together to form binary pairs, then the leftover stages must be driven by amputee binary stages, and the number of sinks in the next level will be between 9 and 18.

Figure 12:
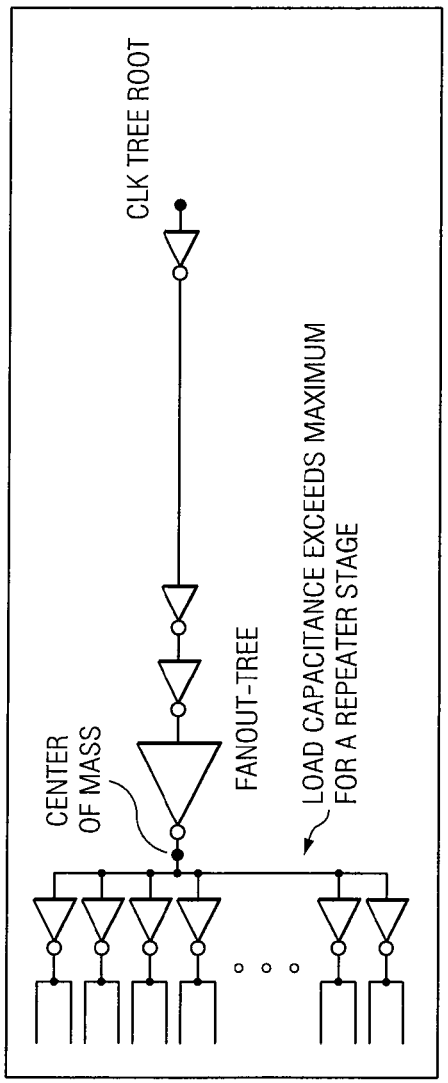
FIG. 12 is a schematic diagram that illustrates one embodiment of a method for reducing a load capacitance below a maximum for a repeater branch.

In some cases, replica stages may converge to the center of mass in only a few stages. For example, a typical branch in a 90 nm CMOS process may be 1-2 mm long. For a 12 mm square chip, the chip center can be reached in as few as 6 stages, which may reduce jitter due to branch mismatch. However, a 64×64 mesh starting with 4,096 mesh buffers will still have 64 buffers concentrated at the center of mass if wired with only binary stages. This situation is remedied by placing a buffer fanout tree at the center of mass to reduce the load capacitance below the maximum for a repeater branch, as illustrated in FIG. 12. The optimum fanout can be determined using a circuit simulator such as SPICE. Once the input capacitance is reduced below the maximum, repeater stages can be used to return to the clock tree root.

The following example, in which n=1 and F=1, further illustrates the principles described above. First, mesh drivers are sized such that their gate capacitances are within the allowable range of Cmin≦CG≦Cmax. If there is no mesh, flip-flops are grouped such that gate capacitances are within the allowable range. Next, a bottom-up, level by level clock tree synthesis is performed recursively starting with the mesh drivers. At each level, a list of output loads to be driven is obtained, and the wire length and the wire width of the replica stage are determined from a replica stage polynomial model and the size of each output load. The input buffer's size (of the replica stage) is calculated based on F. Since the length of the wire attached to the load buffer is fixed, the replica stage input buffer's placement should lie on or inside the diamond surrounding load buffer. The Manhattan distance of any point on the circumference of the diamond is equal to the length of the wire. These diamonds are calculated for each load. At each level, the input buffers are grouped into sets. Each set contains input buffers that have their diamonds intersecting. A minimum intersecting area can be enforced as a condition for a buffer to be part of a set. This restriction can help the downstream placer. All input buffers that belong to one set should be merged. The capacitance of a set, Cset, is the sum of gate capacitances of all input buffers that belong to that set. If Csetmax is the capacitance of the set with maximum capacitance, a divisor λ is selected such that C≦(Csetmax/λ)≦C. If λ>1 for each set, then Cmin≦(Cset/λ)≦Cmax. If this condition is not satisfied, amputee (dummy replica stages) replica stages may be added to increase Cset such that the above inequality is preserved. At each level, one buffer is introduced for each set. The gate capacitance, CI, of this buffer is equal to Cset. This buffer is connected to the loads of its set with wires whose lengths and widths were previously calculated based on their respective load. If λ>1, the buffers introduced in the previous step are scaled down by attaching cascaded inverters to each buffer such that the new gate capacitance is within allowable range. Since all the buffers introduced in the previous step fall within the allowable size range, cascaded inverter stages that are attached to these buffers should be identical. These cascaded inverters follow a fanout of 4 rule. These steps are repeated until all buffers reach the center of mass.

This example may be extended by allowing F to vary. Before the divisor λ is calculated, different values of F are tried to constrain the maximum capacitance of the buffer-set. Moreover, repeater stages with F>1 may be used instead of cascaded inverters, which may be more difficult to place.

After clock network synthesis, signal routing is invoked. Thereafter, air-bridge insertion is done for replica nets. This is to ensure that the actual clock net capacitance is consistent with assumptions made for capacitance extraction while characterizing the technology. If a replica clock wire is on layer i, a ground wire is inserted on each unoccupied track on layers i+1 and i−1. This wire connects the shields on the two sides of the clock wire. Note that airbridge insertion is a crucial step in the flow. Without it, up to 30% discrepancies in the actual replica wire capacitances with the desired values were seen, leading to significant skews.

Simulation of a clock network requires output of two types of data: nominal clock arrival times, and arrival time uncertainties. The nominal clock arrival times assume a fixed PVT, but this does not mean nominal PVT (typical process, 25 C, 1.2V). Rather it implies a fixed corner, such as a slow process (85 C, 1.1 V). The differences between the nominal clock arrival times at each sink are referred to skew. Arrival time uncertainties are generally based on statistical PVT fluctuations, around the nominal process. The nominal clock arrival times can be simulated with a single SPICE analysis, but jitter requires either a Monte Carlo analysis or a sensitivity analysis that is proved to match a full Monte Carlo analysis.

A replica-based clock tree has the same delay on each branch. Thus, only one branch needs to be simulated at each PVT corner, and the results may be applied to all branches. Clock tree timing analysis at any PVT corner is thus reduced to a single SPICE simulation (or one SPICE simulation for each type of replica branch), and some addition.

Figure 13:
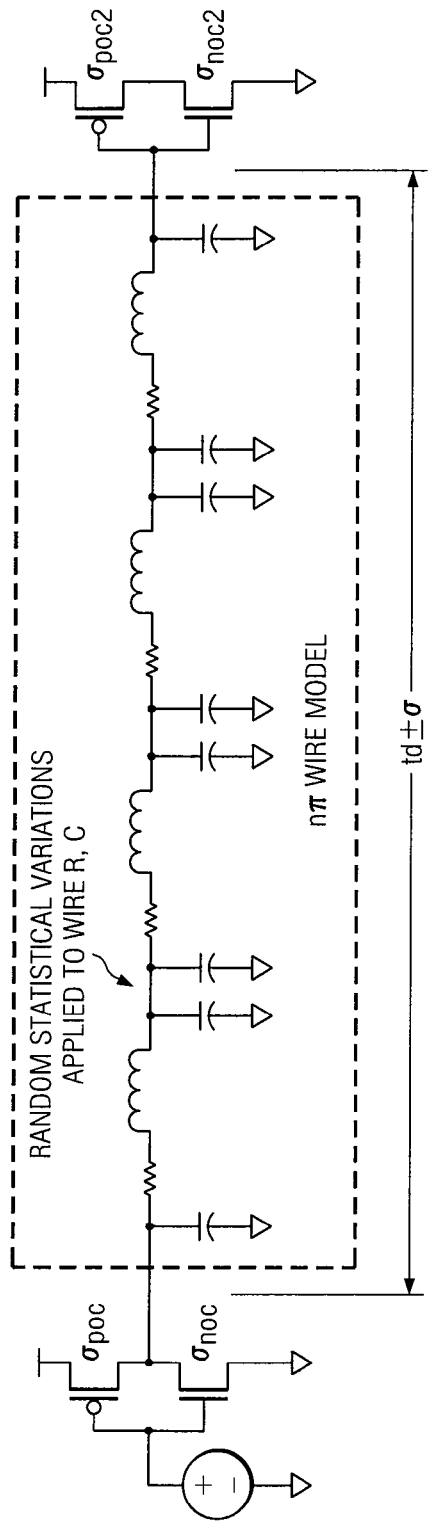
FIG. 13 is a schematic diagram of a Monte Carlo simulation applied to a branch of one embodiment of a replica-based tree.
Figure 14:
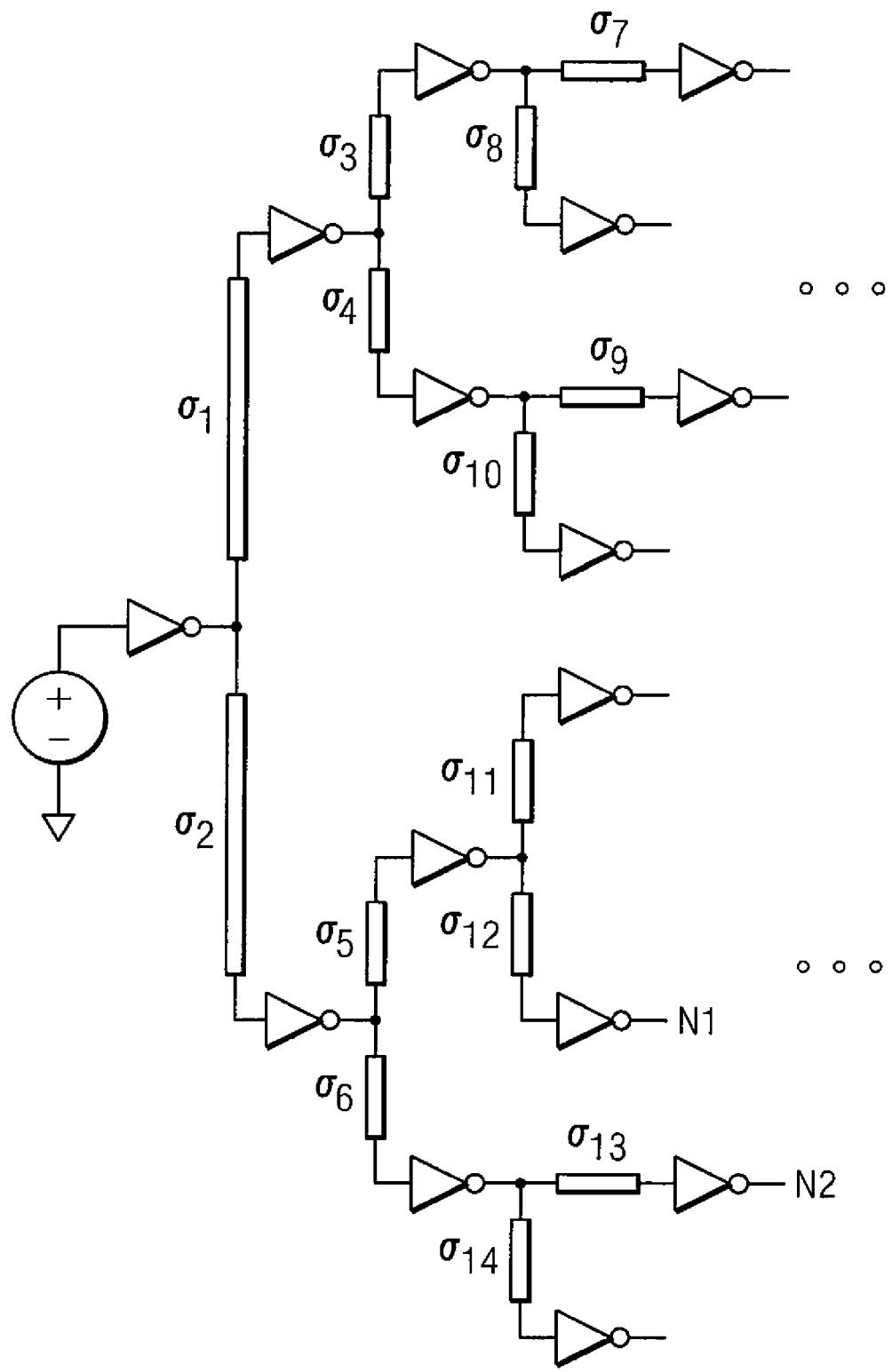
FIG. 14 is a schematic diagram that illustrates the simulated uncertainty of clock arrival time in each branch of a replica-based tree.

Similarly, a replica-based clock tree has the same delay histogram on all replica branches of a tree level when running Monte Carlo simulation over a statistical set of PVT conditions. Thus, for each tree level a Monte Carlo simulation can be run on just one branch, as illustrated in FIG. 13, and the results applied to all its replicas to determine the clock arrival time uncertainty. Clock uncertainty in a fanout tree is evaluated level-by-level and the results are combined statistically based on the relative positions of the branches in a tree. FIG. 14 illustrates the simulated uncertainty in each branch ($\sigma 1$, $\sigma 2$, $\sigma 3$, etc.). The same cycle uncertainty between N1 and N2 in FIG. 14 is then calculated as the square root of the sum of the squares of the uncertainty in each branch between N1 and N2 ($\sigma 5$, $\sigma 6$, $\sigma 12$, $\sigma 13$).

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. A method of constructing a replica stage for a circuit having an output buffer, the method comprising:
    using a circuit simulator, determining a size of an input buffer of the circuit for driving a load capacitance of the output buffer of the circuit based on the size of the output buffer and a fanout;
    using a circuit simulator, determining a wire width and a wire length of the circuit based on the size of the output buffer, the fanout and a replica stage mathematical model, wherein the mathematical model represents the wire width and wire length of replica stages as a function of load buffer size
    connecting the output buffer and the input buffer to a conductor of the circuit, wherein the conductor has the wire length and the wire width, the conductor is routed on one or more predetermined metal layers, and the conductor is placed within ground shields of fixed width.

2. The method of claim 1, wherein the size of the input buffer is the size of the output buffer divided by the fanout.

3. The method of claim 1, further comprising constructing the replica stage mathematical model for the given fanout, wherein constructing the replica stage mathematical model comprises:
    simulating a model maximum circuit stage, which has a predetermined maximum output buffer size and a predetermined maximum wire width, to identify model input buffer size based on the fanout, to identify model wire length that minimizes a target function of the model maximum circuit stage, to compute a transmission time of a signal in the model maximum circuit stage and to compute a ratio of the capacitance of the output buffer and a wire capacitance in the model maximum circuit stage;
    simulating a model minimum circuit stage, which has a predetermined minimum wire width, to identify model wire length, model output buffer size, and model input buffer size, wherein a transmission time of a signal in the model minimum circuit stage is equal to the transmission time of the signal in the model maximum circuit stage;
    for a plurality of model wire widths, where each of the model wire widths is less than the predetermined maximum wire width and is greater than the predetermined minimum wire width, simulating a model circuit stage to identify the model wire widths, model output buffer sizes, model input buffer sizes and model wire lengths, wherein the transmission time of the signal in the model circuit stage is a constant for the plurality of model wire widths and is equal to the transmission time of the signal in the model maximum circuit stage;
    fitting coordinate pairs of model wire widths and model output buffer sizes to the mathematical model that represents the wire width as a function of the output buffer size; and
    fitting coordinate pairs of model wire lengths and model output buffer sizes to the mathematical model that represents the wire length as a function of the output buffer size.

4. The method of claim 3, wherein the simulation is constrained by a constant, which is a ratio of an output buffer capacitance of the model circuit stage to a wire capacitance of the model circuit stage and is equal to a ratio of the output buffer capacitance of the model maximum circuit stage to the wire capacitance of the model maximum circuit stage.

5. The method of claim 3, wherein the target function is the transmission time of the signal in the model circuit stage.

6. The method of claim 3, wherein the target function is the transmission time of the signal in the model circuit stage per unit wire length.

7. The method of claim 3, wherein the target function is a power dissipated in the model circuit stage.

8. The method of claim 3, wherein the target function is a combination of the transmission time of the signal in the model circuit stage and power dissipated in the model circuit stage.

9. The method of claim 3, wherein the target function is the combination of the transmission time of the signal in the model circuit stage per unit wire length and power dissipated in the model circuit stage.

10. The method of claim 1, wherein the circuit is a clock network.

11. The method of claim 1, wherein the input buffer is a first input buffer, and wherein if the first input buffer and a second input buffer are adjacent, and if the first input buffer and the second input buffer are connected to a common third input buffer, replacing both the first input buffer and the second input buffer with a fourth input buffer.

12. The method of claim 11, wherein the size of the fourth buffer is the sum of the sizes of the first input buffer and the second input buffer.

13. A method for designing a clock tree having a plurality of levels and each level having a plurality of stages, the method comprising:
for each tree level:
determining a load of one or more output buffers of a circuit;
determining a set of fanouts;
determining a set of mathematical models of replica stages, wherein the mathematical model represents a wire width and wire length of the replica stages as a function of load buffer size
for each fanout and for each mathematical model of replica stages:
for each output buffer of the circuit and using a circuit simulator, determining a size of a corresponding input buffer of the circuit based on the load of the output buffer and the fanout; determining a corresponding wire width and a corresponding wire length of the circuit based on the mathematical model of replica stages and the fanout; and determining a set of legal locations for placing a corresponding input buffer of the circuit within a perimeter of the output buffer of the circuit, wherein the perimeter is constrained by the wire length;
identifying one or more sets of input buffers whose sets of legal locations overlap and sum of whose sizes is less than a predetermined maximum size, and for all the input buffers in each set determining placement locations that are close to each other; and
for each output buffer of the circuit, connecting the output buffer and the corresponding input buffer to a conductor of the circuit having the corresponding wire length and the corresponding wire width, routing the conductor on one or more predetermined metal layers, and placing the conductor within ground shields having a fixed width; and
determining an optimum fanout from the set of fanouts and an optimum mathematical model for the replica stages from the set of mathematical models of replica stages based on a target objective function.

14. The method of claim 13, wherein the size of the input buffer is a size of the output buffer divided by the fanout.

15. The method of claim 13, further comprising replacing a plurality of the input buffers in the same set with a combined input buffer.

16. The method of claim 15, wherein a size of the combined input buffer is the sum of the sizes of the replaced input buffers.

17. The method of claim 13, wherein the target objective function for determining the optimum fanout and the optimum mathematical model for the replica stages at a tree level minimizes power dissipated in the tree level.

18. The method of claim 13, wherein the target objective function for determining the optimum fanout and the optimum mathematical model for the replica stages at the tree level minimizes transmission time for the signal in the tree level.

19. The method of claim 13, wherein the target objective function for determining the optimum fanout and the optimum mathematical model for the replica stages at the tree level minimizes the number of input buffers at the tree level after merging.

20. The method of claim 13, wherein all input buffers at the tree level become output buffers for the subsequent tree level.

21. The method of claim 13, wherein the input buffers at the first tree level drive sequential end-points through a selected one of a tree and a mesh.

22. The method of claim 21, wherein the size of each input buffer on the first tree level is based on total capacitive load driven by the input buffer.

23. The method of claim 21, further comprising inserting clock gating elements in the first tree level and determining a size of each clock gating element based on total capacitive load of one or more sequential end-points and the connecting wires that are driven by the clock gating element.

24. The method of claim 13, further comprising, if the input buffer is placed from the output buffer at a distance which is less than the wire length computed from the mathematical model of replica stages and if the length of the routed conductor connecting the output buffer and the input buffer is less than the wire length computed from the mathematical model of the replica stages, inserting a routing jog on the conductor connecting the output buffer to the input buffer, such that the routed wire length of the conductor after the jog is inserted is equal to the wire length computed from the mathematical model of the replica stages.

25. The method of claim 13, further comprising, after clock and signal routing are completed, inserting a ground wire on each unoccupied track that is either on metal layer above or below the layer on which a clock wire is routed.

* * * * *

UNITED STATES PATENT AND TRADEMARK OFFICE
CERTIFICATE OF CORRECTION

| | | |
|---|---|---|
| PATENT NO. | : 8,255,196 B2 | Page 1 of 1 |
| APPLICATION NO. | : 12/197572 | |
| DATED | : August 28, 2012 | |
| INVENTOR(S) | : William W. Walker et al. | |

It is certified that error appears in the above-identified patent and that said Letters Patent is hereby corrected as shown below:

On the Title page of the patent: (75) Inventors:

Before "Murgai" delete "Ranjeez" and insert --Rajeev--.

Signed and Sealed this
Fourteenth Day of October, 2014

Michelle K. Lee
*Deputy Director of the United States Patent and Trademark Office*